United States Patent
Hirobe et al.

(10) Patent No.: US 9,548,453 B2
(45) Date of Patent: *Jan. 17, 2017

(54) MULTIPLE-SURFACE IMPOSITION VAPOR DEPOSITION MASK

(71) Applicant: DAI NIPPON PRINTING CO., LTD., Tokyo (JP)

(72) Inventors: Yoshinori Hirobe, Tokyo (JP); Yutaka Matsumoto, Tokyo (JP); Masato Ushikusa, Tokyo (JP); Toshihiko Takeda, Tokyo (JP); Katsunari Obata, Tokyo (JP); Hiroyuki Nishimura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/879,386

(22) Filed: Oct. 9, 2015

(65) Prior Publication Data

US 2016/0163983 A1    Jun. 9, 2016

Related U.S. Application Data

(62) Division of application No. 14/371,181, filed as application No. PCT/JP2013/050426 on Jan. 11, 2013.

(30) Foreign Application Priority Data

Jan. 12, 2012    (JP) ................................ 2012-004488

(51) Int. Cl.
   *C23C 16/04*    (2006.01)
   *H01L 51/00*    (2006.01)
   (Continued)

(52) U.S. Cl.
   CPC ......... *H01L 51/0011* (2013.01); *C23C 14/042* (2013.01); *C23C 14/24* (2013.01);
   (Continued)

(58) Field of Classification Search
   None
   See application file for complete search history.

(56) References Cited

U.S. PATENT DOCUMENTS 5,792,520 A    8/1998   Yamashita et al.
6,633,124 B2 *  10/2003  Himeshima ......... H01L 27/3283
                                                313/505
(Continued)

FOREIGN PATENT DOCUMENTS

JP    63-076859 A1    4/1988
JP    07-300664       11/1995
(Continued)

OTHER PUBLICATIONS

International Search Report PCT/JP2013/050426 dated Feb. 19, 2013.
(Continued)

*Primary Examiner* — Alexander Ghyka
(74) *Attorney, Agent, or Firm* — Burr & Brown, PLLC

(57) ABSTRACT

A method for producing a multiple-surface imposition vapor deposition mask enhances definition and reduces weight even when a size is increased. Each of multiple masks in an open space in a frame is configured by a metal mask having a slit, and a resin mask that is positioned on a front surface of the metal mask and has openings corresponding to a pattern to be produced by vapor deposition arranged by lengthwise and crosswise in a plurality of rows. In formation of the plurality of masks, after each of the metal masks and a resin film material for producing the resin mask are attached to the frame, the resin film material is processed,
(Continued)

and the openings corresponding to the pattern to be produced by vapor deposition are formed in a plurality of rows lengthwise and crosswise, whereby the multiple-surface imposition vapor deposition mask of the above described configuration is produced.

1 Claim, 9 Drawing Sheets

(51) Int. Cl.
*C23C 14/24* (2006.01)
*C23C 14/04* (2006.01)
*H01L 51/56* (2006.01)

(52) U.S. Cl.
CPC .......... *C23C 16/042* (2013.01); *H01L 51/56* (2013.01); *Y10T 29/49826* (2015.01)

(56) References Cited

U.S. PATENT DOCUMENTS

| | | | |
|---|---|---|---|
| 6,858,086 B2 | 2/2005 | Kang | |
| 9,203,028 B2 * | 12/2015 | Takeda | C23C 14/042 |
| 2003/0101932 A1 | 6/2003 | Kang | |
| 2007/0017895 A1 | 1/2007 | Yotsuya et al. | |
| 2007/0148337 A1 | 6/2007 | Nichols et al. | |
| 2008/0038935 A1 | 2/2008 | Baude et al. | |
| 2008/0314743 A1 | 12/2008 | Lee et al. | |
| 2009/0229638 A1 | 9/2009 | Yun et al. | |
| 2010/0021119 A1 | 1/2010 | Ohtsu et al. | |
| 2014/0146391 A1 | 5/2014 | Jang et al. | |
| 2015/0017759 A1 | 1/2015 | Hirobe et al. | |
| 2015/0037928 A1 | 2/2015 | Hirobe et al. | |

FOREIGN PATENT DOCUMENTS

| | | |
|---|---|---|
| JP | 2002-235166 | 8/2002 |
| JP | 2003-217850 | 7/2003 |
| JP | 2003-332057 | 11/2003 |
| JP | 2004-190057 | 7/2004 |
| JP | 2008-121060 | 5/2008 |
| JP | 2009-001895 | 1/2009 |
| TW | 200632541 A | 9/2006 |
| TW | 200718268 A | 5/2007 |

OTHER PUBLICATIONS

Taiwanese Office Action (Application No. 104129105) dated May 18, 2016.

Japanese Office Action (Application No. 2013-117239) dated Aug. 23, 2016 (with English translation).

* cited by examiner

FIG. 4
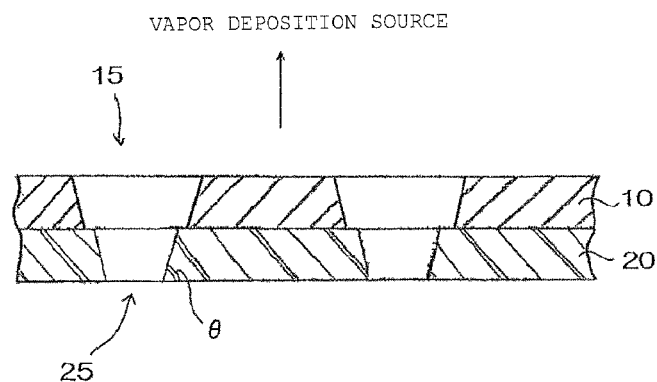
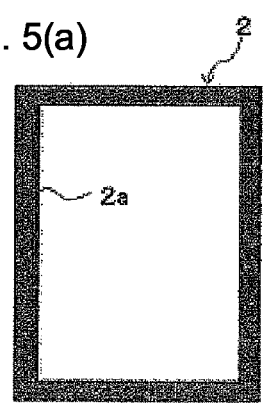
FIG. 5(a)
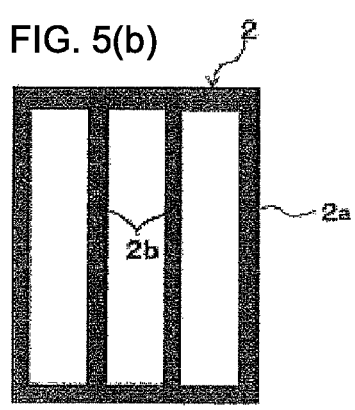
FIG. 5(b)
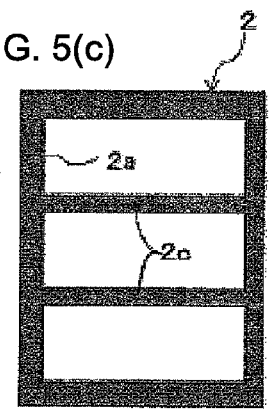
FIG. 5(c)
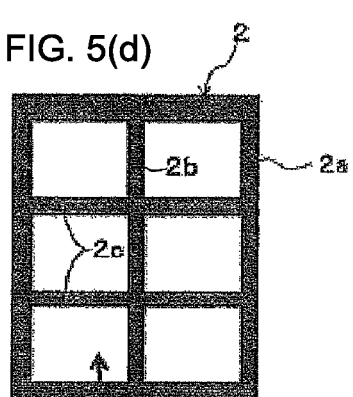
FIG. 5(d)

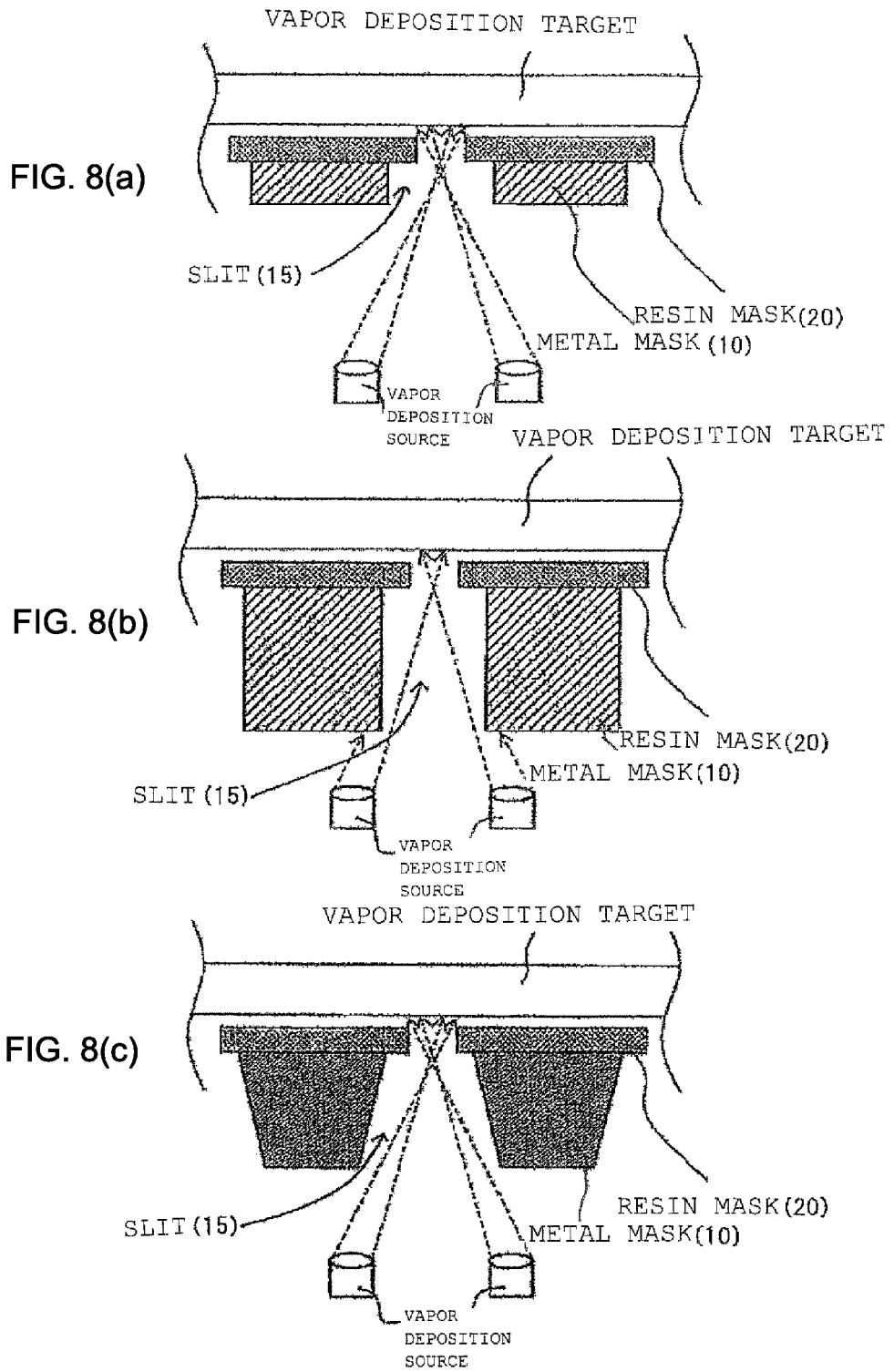

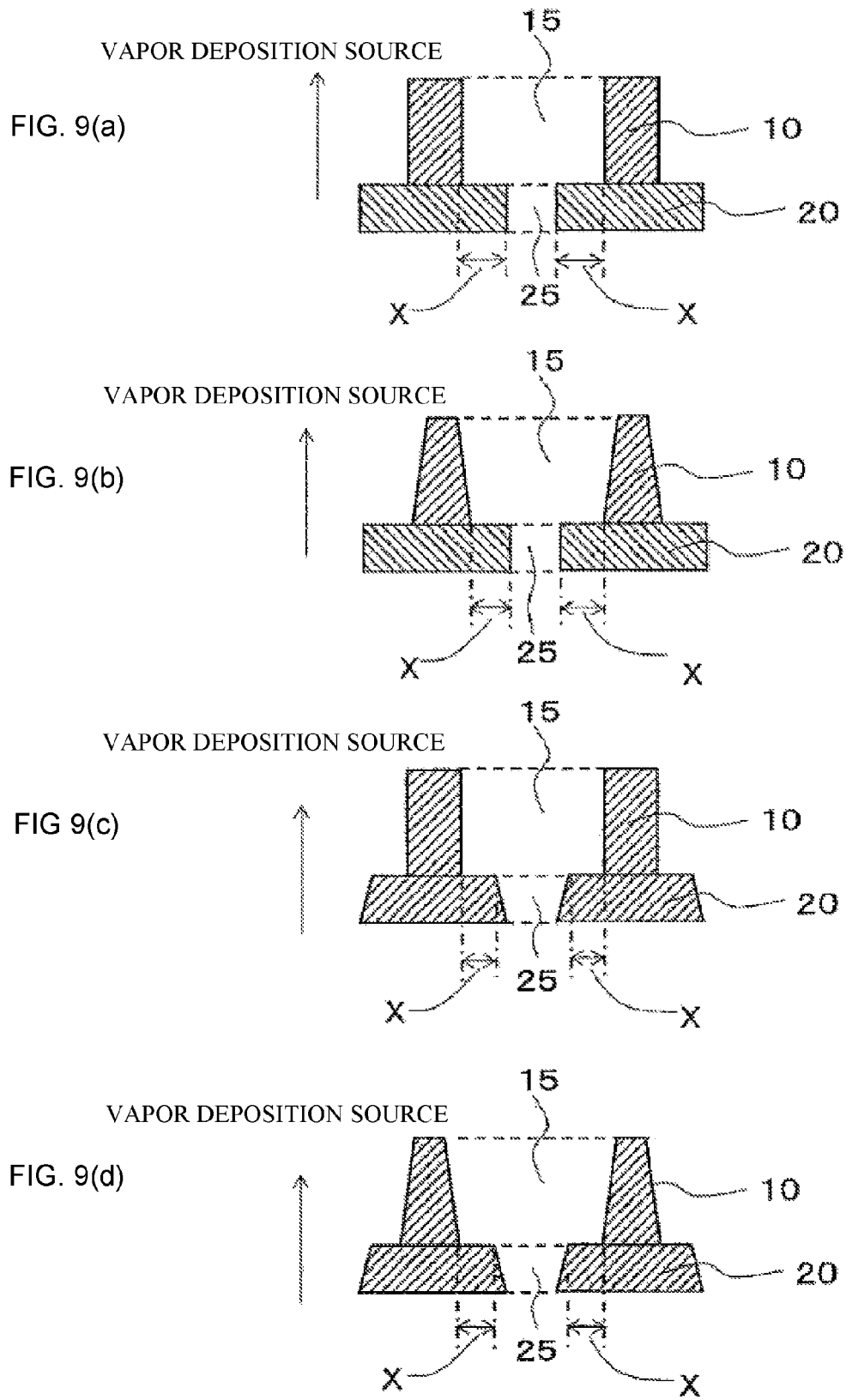

MULTIPLE-SURFACE IMPOSITION VAPOR DEPOSITION MASK

TECHNICAL FIELD

The present invention relates to a method for producing a multiple-surface imposition vapor deposition mask, a multiple-surface imposition vapor deposition mask obtained therefrom, and a method for producing an organic semiconductor element.

BACKGROUND ART

Conventionally, in production of an organic EL element, a vapor deposition mask that is composed of a metal formed by a number of microscopic slits being arranged in parallel with one another at microscopic spaces in a region that should be subjected to vapor deposition, for example, has been used in formation of an organic layer of an organic EL element or a cathode electrode. While in the case of using the vapor deposition mask, the vapor deposition mask is placed on a substrate front surface that should be subjected to vapor deposition and is held by using a magnet from a back surface, the rigidity of the slits is extremely small, and therefore, distortion easily occurs to the slits when the vapor deposition mask is held on the substrate front surface, which becomes an obstacle to enhancement in definition or upsizing of the products in which the slit lengths are large.

Various studies have been made on the vapor deposition masks for preventing distortion of slits, and, for example, Patent Literature 1 proposes a vapor deposition mask including a base plate that also serves a first metal mask including a plurality of openings, a second metal mask including a number of microscopic slits in regions to cover the aforementioned openings, and a mask pulling and holding device that positions the second metal mask on the base plate in a state in which the second metal mask is pulled in the longitudinal direction of the slits. Namely, the vapor deposition mask with two kinds of metal masks being combined is proposed. It is indicated that according to the vapor deposition mask, slit precision can be ensured without occurrence of distortion to the slits.

Incidentally, in recent years, with upsizing of the products using organic EL elements or increase in substrate sizes, a demand for upsizing are also growing with respect to vapor deposition masks, and the metal plates for use in production of the vapor deposition masks composed of metals are also upsized. However, with the present metal processing technique, it is difficult to form slits in a large metal plate with high precision, and even if distortion in slit portions can be prevented by the method proposed in the above described Patent Literature 1 or the like, the method or the like cannot respond to enhancement in definition of the slits. Further, in the case of use of a vapor deposition mask composed of only a metal, the weight thereof also increases with upsizing, and the total mass including a frame also increases, which becomes a hindrance to handling.

Furthermore, while a vapor deposition mask is usually used in a state fixed to the frame, when the vapor deposition mask is upsized, there arises the problem of being incapable of performing positioning of the frame and the vapor deposition mask with high precision. In particular, in the case of a multiple-surface imposition vapor deposition mask configured by arranging a plurality of masks by dividing the plurality of masks in lengthwise and crosswise directions of the inside of the frame, displacement occurs to opening patterns of the respective masks unless positioning of the respective masks and the frame is performed with high precision, and therefore, the positioning precision problem becomes noticeable.

Further, in regard with a multiple-surface imposition vapor deposition mask, Patent Literature 2 proposes the configuration in which as the vapor deposition mask to be attached to the frame, a plurality of strip-shaped unit masks divided in the longitudinal direction of a frame opening (In the unit mask, a plurality of unit masking patterns are formed at predetermined spaces along the longitudinal direction thereof.) are used, and both end portions of the respective plurality of unit masks are fixed and attached to the frame in the short length direction of the frame opening so as to be given a predetermined pulling force. It is indicated that according to the configuration, even if the multiple-surface imposition vapor deposition mask (the opening area of the frame) is upsized, the positional displacements of the respective unit masking patterns due to distortion by the tare weight of the mask and the like can be restrained.

By using a plurality of strip-shaped unit masks as in Patent Literature 2, the positioning displacement in one direction (a short length direction) in the frame opening is certainly restrained to some degree, but unless positioning at the time of attaching the unit masks in the strip shapes respectively to the frame is also performed with high precision, the problem of displacement of the opening pattern in the other direction (the longitudinal direction) is not solved. Further, since the unit mask in the strip shape is constructed by a metal plate, the problem of positional displacements of the respective unit masking patterns due to distortion by the tare weights of the masks and the like, and the problem of difficulty in handling due to increase in the total mass including the frame are not thoroughly solved.

CITATION LIST

Patent Literature

[Patent Literature 1] Japanese Patent Laid-Open No. 2003-332057
[Patent Literature 2] Japanese Patent Laid-Open No. 2003-217850

SUMMARY OF INVENTION

Technical Problem

The present invention is made in the light of the situation as above, and has main problems of providing a method for producing a multiple-surface imposition vapor deposition mask that can satisfy both enhancement in definition and reduction in weight even when a size is increased, and of providing a multiple-surface imposition vapor deposition mask that is obtained in this manner, and a method for producing an organic semiconductor element that can produce the organic semiconductor element with high precision.

Solution to Problem

The present invention for solving the above described problem is a method for producing a multiple-surface imposition vapor deposition mask formed by arranging a plurality of masks in an open space in a frame by dividing the plurality of masks in lengthwise and crosswise directions of the open space, and has the steps of preparing the frame, attaching a plurality of metal masks provided with slits, and a resin film material positioned on front surface sides of the plurality of metal masks, to the frame, and producing a resin mask by processing the resin film material, and forming openings corresponding to a pattern to be produced by vapor deposition in a plurality of rows lengthwise and crosswise.

In the above described invention, (1) the frame is configured to have sash bar portions that divide the open space into a plurality of portions in lengthwise and crosswise directions, a plurality of sheets of the resin film material that have dimensions individually corresponding to the respective metal masks can be used as the resin film material. In this case, the metal masks are respectively arranged at predetermined positions on the respective sheets of the resin film material, before or after the respective plurality of sheets of the resin film material are attached to the sash bar portions of the frame.

In the invention described above, (2) the resin film material may be of a single sheet that substantially covers an entire surface of the open space in the frame. In this case, the plurality of metal masks can be respectively arranged at predetermined positions on the resin film material before or after the resin film material is attached to the frame.

In the invention described above, (3) as the resin film material, a plurality of sheets of the resin film material each having a length corresponding to a dimension in a direction of any one of the lengthwise and crosswise directions of the open space in the frame, and having a length shorter than a dimension of the open space in the other direction may be combined. In this case, the plurality of metal masks are respectively arranged at predetermined positions on the resin film material before or after the resin film material is attached to the frame.

Further, in the above described invention, as the plurality of metal masks, some of the plurality of metal masks, for example, all or some of the metal masks in a single row in the lengthwise and crosswise arrangement are formed as a metal mask aggregate member that is integrally formed, and a plurality of the metal mask aggregate members can be used.

Further, in the above described invention, in arranging the metal mask in the frame, a maximum allowable error in a width direction of a slit between an arrangement position in design thereof and an actual arrangement position can be set to be within 0.2 times as large as a pitch of the openings, and a maximum allowable error in a lengthwise direction of the slit can be set to be within 5 mm.

Further, in the above described invention, the step of attaching a metal plate for producing the respective metal masks, and a resin film material for producing the resin mask to the frame is performed, in place of the step of attaching the respective metal masks and the resin film material for producing the resin mask to the frame, the metal plate is processed in a state in which the metal plate and the resin film material are attached to the frame, slits that penetrate through only the metal plate are provided to form the metal masks, after which, the resin film material is processed, and openings corresponding to a pattern to be produced by vapor deposition can be formed in a plurality of rows lengthwise and crosswise.

Further, in the above described invention, in forming the openings corresponding to the pattern to be produced by vapor deposition in a plurality of rows lengthwise and crosswise by processing the resin film material, a reference sheet provided with the pattern corresponding to the openings in advance is prepared, the reference sheet is bonded onto a surface of the resin film material at a side where the metal mask is not provided, laser irradiation is performed in accordance with the pattern of the reference sheet from the metal mask side while the pattern on the reference sheet is being recognized through the resin film material, and an opening pattern can be formed in the resin film material.

Further, the present invention for solving the above described problem is a multiple-surface imposition vapor deposition mask formed by arranging a plurality of masks in an open space in a frame by dividing the plurality of masks in lengthwise and crosswise directions of the open space, wherein each of the masks is configured by a metal mask provided with a slit, and a resin mask that is positioned on a front surface of the metal mask, and has openings corresponding to a pattern to be produced by vapor deposition arranged in a plurality of rows lengthwise and crosswise.

Further, the present invention for solving the above described problem is a method for producing an organic semiconductor element, wherein the multiple-surface imposition vapor deposition mask that is produced according to the production method having the above described features is used.

Advantageous Effects of Invention

According to the method for producing a multiple-surface imposition vapor deposition mask of the present invention, the weight can be reduced by configuring each mask of the plurality of masks that are arranged in the frame by the metal mask provided with slits, and the resin mask that is positioned on the front surface of the metal mask, and has the openings corresponding to the pattern to be produced by vapor deposition arranged by lengthwise and crosswise in a plurality of rows. Therefore, even when the size is increased, reduction in weight is enabled.

Furthermore, after the plurality of metal masks and the resin film material for forming the resin mask are arranged in the frame, the resin film material is processed, and the openings corresponding to the pattern to be produced by vapor deposition are accurately provided. Therefore, minute precision at the time of arranging the metal masks is not required, and even if the metal masks are arranged relatively roughly, enhancement in definition of the mask is enabled. Like this, according to the present invention, the multiple-surface imposition vapor deposition mask capable of satisfying both enhancement in definition and reduction in weight can be easily produced with high yield.

Further, according to the multiple-surface imposition vapor deposition mask of the present invention, both enhancement in definition and reduction in weight are satisfied as described above, and therefore, vapor deposition processing in production of an organic semiconductor element or the like can be carried out with high precision.

Furthermore, according to the method for manufacturing an organic semiconductor element of the present invention, an organic semiconductor element can be produced with high precision.

BRIEF DESCRIPTION OF DRAWINGS

FIG. 4 is an enlarged sectional view of the vapor deposition mask portions shown in FIG. 3(b). A front view of the vapor deposition mask showing, seen from the metal mask side, and (c) is a partial enlarged sectional view of (b).

FIGS. 5(a) to (d) are schematic views showing configuration examples of a frame of the multiple-surface imposition vapor deposition mask obtained according to a production method of the present invention.

FIGS. 8(a) to (c) are schematic sectional views showing a relation of a shadow and a thickness of the metal mask for first through third variations of the metal mask.

FIGS. 9(a) to (d) are partial schematic sectional views showing first through fourth variations of a relation of a slit of the metal mask, and an opening of a resin mask.

DESCRIPTION OF EMBODIMENTS

Hereinafter, the present invention will be described specifically with use of the drawings.

First, prior to explanation of a method for producing a multiple-surface imposition vapor deposition mask of the present invention, a configuration of the multiple-surface imposition vapor deposition mask according to the present invention that is obtained according to the production method will be described.

The multiple-surface imposition vapor deposition mask of the present invention is a multiple-surface imposition vapor deposition mask formed by arranging a plurality of masks in an open space in a frame by dividing the plurality of masks in lengthwise and crosswise directions thereof, wherein the aforementioned respective masks are each configured by a metal mask provided with slits and a resin mask that is positioned on a front surface of the metal mask, and has a openings corresponding to a pattern to be produced by vapor deposition arranged by lengthwise and crosswise in a plurality of rows.

Figure 1:
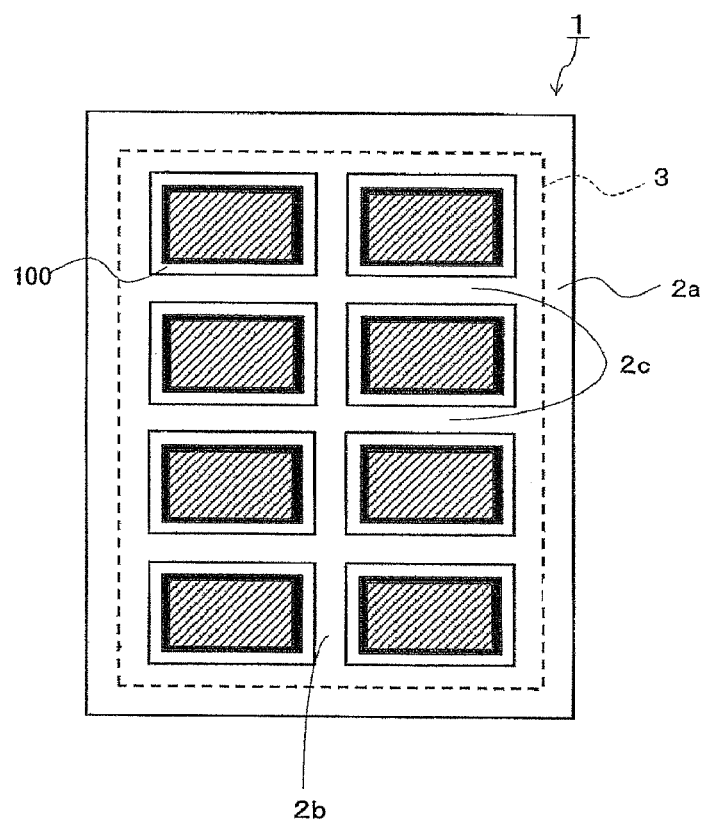
FIG. 1 is a view schematically showing a configuration of one embodiment of a multiple-surface imposition vapor deposition mask obtained according to a production method of the present invention.

A multiple-surface imposition vapor deposition mask 1 according to the present invention is formed by arranging a plurality of masks 100 in an open space 3 in a frame 2 by dividing the plurality of masks 100 in lengthwise and crosswise directions of the open space, as shown in FIG. 1, for example.

Figure 2A:
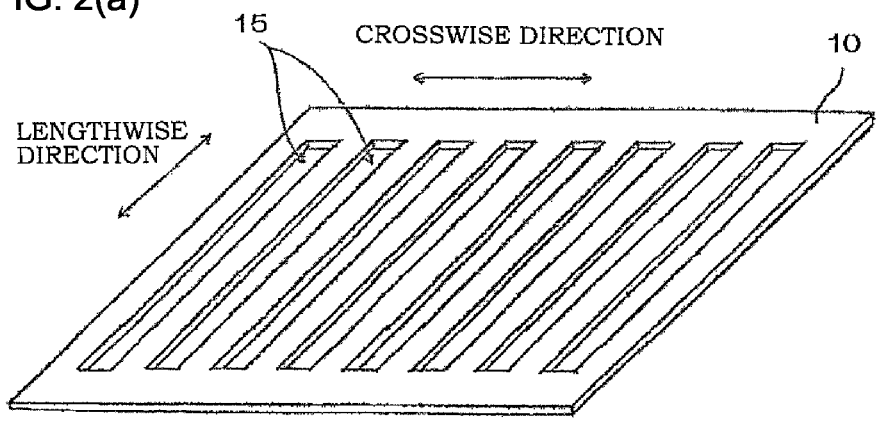
FIG. 2(*a*) is a schematic enlarged perspective view that shows a metal mask of a mask portion by exploding the mask portion, and is for explaining configurations of the respective mask portions in one embodiment of the multiple-surface imposition vapor deposition mask shown in FIG. 1.
FIG. 2(b) is a schematic enlarged perspective view that shows a resin mask of a mask portion by exploding the mask portion, and is for explaining configurations of the respective mask portions in one embodiment of the multiple-surface imposition vapor deposition mask shown in FIG. 1.
Figure 2B:
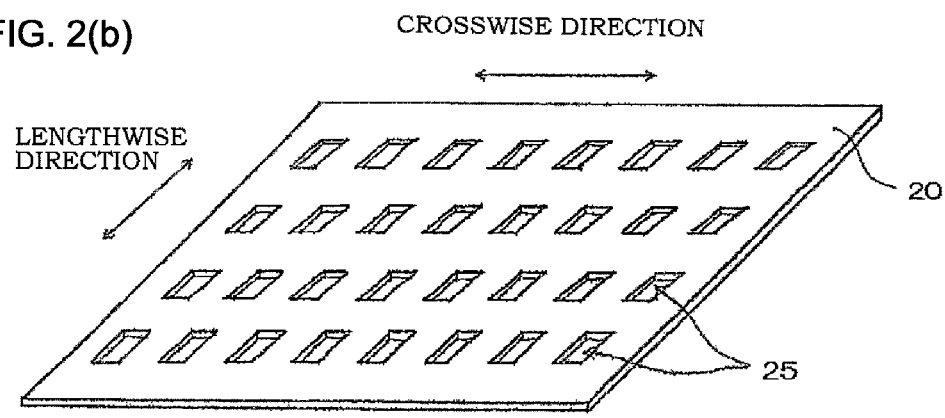

Here, when a configuration of a portion of each mask 100 of the plurality of masks arranged in the frame 2 is seen, the configuration is adopted, in which a metal mask 10 provided with slits 15, and a resin mask 20 which is positioned on one surface of the metal mask 10 (an undersurface of the metal mask 10 in a case shown in FIG. 2(b)), and has openings 25 corresponding to a pattern to be produced by vapor deposition arranged by lengthwise and crosswise in a plurality of rows are stacked, as shown in FIGS. 2 to 4.

Here, when a mass of the mask 100, and a mass of the vapor deposition mask that is composed of only a metal and is conventionally known are compared on the assumption that thicknesses of the entire vapor deposition masks are the same, the mass of the vapor deposition mask 100 of the present invention is lighter by an amount of a part of the metal material of the conventionally known vapor deposition mask, which is replaced with a resin material. Further, in order to reduce weight by using the vapor deposition mask composed of only a metal, it is necessary to reduce the thickness of the vapor deposition mask, but when the thickness of the vapor deposition mask is reduced, distortion sometimes occurs to the vapor deposition mask, and reduction in durability sometimes occurs when upsizing the vapor deposition mask. Meanwhile, according to the mask according to the present invention, even when the thickness of the entire vapor deposition mask is increased to satisfy distortion and durability at the time of the mask being upsized, reduction in weight can be achieved more than the vapor deposition mask that is formed of only a metal by the presence of the resin mask 20. Accordingly, in the multiple-surface imposition vapor deposition mask 1 of the present invention in the form of a combination of a plurality of vapor deposition masks 100 each adopting the configuration like this, the effect of weight reduction by using the resin material as described above is especially enhanced, and the problem of positional displacement of each unit masking pattern due to distortion by the tare weight or the like, and the problem of difficulty in handling due to increase in the total mass including the frame are solved even if the vapor deposition mask 1 is upsized. Further, by using the resin material, after a resin film to be an original sheet for the resin mask (and the metal mask) is attached to the frame, the resin film is processed, and the openings corresponding to a predetermined pattern can be formed in the production process thereof, as will be described later. Therefore, the problem of positional displacements of the openings in the case of attaching the mask provided with the openings in advance to the frame also can be solved. Furthermore, by using the resin film, a reference sheet that is provided in advance with a pattern to be produced by vapor deposition, namely, the pattern corresponding to the openings to be formed, for example, is prepared as will be described later, and the opening pattern is enabled to be formed by laser irradiation or the like while the pattern on the reference sheet is being watched in a state in which the reference sheet is bonded to the resin film material, namely, the openings are enabled to be formed in the resin film material in a so-called face-to-face state. Thereby, the multiple-surface imposition vapor deposition mask having the openings with high definition in which dimensional precision and positional precision of the openings are extremely high can be provided.

Hereinafter, respective members configuring the multiple-surface imposition vapor deposition mask of the present invention will be described specifically.

(Resin Mask)

The resin mask 20 is composed of a resin, and as shown in FIG. 2(b), the openings 25 corresponding to a pattern to be produced by vapor deposition are arranged by lengthwise and crosswise in a plurality of rows. Note that formation of the openings 25 is performed after the metal mask 10 and a resin film material 200 to be the original sheet of the resin mask are bonded to the frame 2 as will be described later. Accordingly, as shown in FIG. 2 to FIG. 4, the openings 25 of the resin mask are formed in positions overlapping the slits 15 of the metal mask 10. Further, the pattern to be produced by vapor deposition in the description of the present application means the pattern to be produced by using the vapor deposition mask, and, for example, when the vapor deposition mask is used in formation of an organic layer of an organic EL element, the pattern is in a shape of the organic layer.

For the resin mask 20, a conventionally known resin material can be properly selected and used, and while the material is not especially limited, a material that enables formation of the opening 25 with high definition by laser processing or the like, has a low rate of dimensional change and a low rate of humidity absorption under heat and with passage of time, and is lightweight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials illustrated in the above, the resin materials with the thermal expansion coefficients of 16 ppm/° C. or less are preferable, the resin materials with rates of humidity absorption of 1.0% or less are preferable, and the resin materials including both the conditions are especially preferable. In the present invention, the resin mask 20 is composed of the resin material that enables formation of the openings 25 with high definition as compared with the metal material as described above. Accordingly, the vapor deposition mask 100 having the openings 25 with high definition can be provided.

While the thickness of the resin mask 20 is not especially limited, the resin mask 20 is preferably as thin as possible in order to prevent occurrence of an insufficient vapor deposition portion, namely, a vapor deposition portion with a film thickness smaller than the intended vapor deposition film thickness, a so-called shadow, in the pattern that is produced by vapor deposition, when vapor deposition is performed with use of the vapor deposition mask 100 of the present invention. However, when the thickness of the resin mask 20 is less than 3 µm, a defect such as a pinhole easily occurs, and the risk of deformation or the like increases. Meanwhile, when the thickness of the resin mask 20 exceeds 25 µm, generation of a shadow can arise. With this point taken into consideration, the thickness of the resin mask 20 is preferably from 3 µm to 25µ inclusive. By setting the thickness of the resin mask 20 within this range, the defect such as a pinhole and the risk of deformation or the like can be reduced, and generation of a shadow can be effectively prevented. In particular, the thickness of the resin mask 20 is set to be from 3 µm to 10 µm inclusive, more preferably, from 4 µm to 8 µm inclusive, whereby the influence of a shadow at the time of forming a high-definition pattern exceeding 300 ppi can be prevented more effectively. Note that in the mask 100, the metal mask 10 and the resin mask 20 may be directly bonded, or may be bonded via an adhesive layer, and when the metal mask 10 and the resin mask 20 are bonded via the adhesive layer, the total thickness of the resin mask 20 and the adhesive layer is preferably set to be within a range from 3 µm to 25 µm inclusive, preferably from 3 µm to 10 µm inclusive, and more preferably, from 4 µm to 8 µm inclusive.

The shape and the size of the opening 25 are not especially limited, and can be the shape and the size corresponding to the pattern to be produced by vapor deposition. Further, as shown in FIG. 3($a$), a pitch P1 in a crosswise direction of the adjacent openings 25, and a pitch P2 in a lengthwise direction can be also properly set in accordance with the pattern to be produced by vapor deposition.

The positions at which the openings 25 are provided and the number of the openings 25 are not specially limited, and a single opening 25 may be provided at a position overlapping the slit 15, or a plurality of openings 25 may be provided in the lengthwise direction, or the crosswise direction. For example, as shown in FIG. 3($c$), when the slit extends in the lengthwise direction, two or more of the openings 25 that overlap the slit 15 may be provided in the crosswise direction.

A sectional shape of the opening 25 is not specially limited, and end surfaces that face each other of the resin mask forming the opening 25 may be substantially parallel with each other, but the sectional shape of the opening 25 is preferably is the shape having broadening toward a vapor deposition source. In other words, the sectional shape of the opening 25 preferably has a taper surface having broadening toward the metal mask 10 side. By making the sectional shape of the opening 25 have the above configuration, a shadow can be prevented from being generated in the pattern that is produced by vapor deposition when vapor deposition is performed with use of the vapor deposition mask of the present invention. While a taper angle θ shown in FIG. 4 can be properly set with the thickness or the like of the resin mask 20 taken into consideration, an angle (θ) connecting a lower bottom distal end in the opening of the resin mask and an upper bottom distal end in the opening of the same resin mask is preferably within a range from 25° to 65°. In particular, within this range, the angle (θ) is preferably an angle smaller than a vapor deposition angle of a vapor deposition machine to be used. Furthermore, in FIG. 3($b$) and FIG. 4, an end surface 25$a$ that forms the opening 25 shows a linear shape, but the end surface 25$a$ is not limited thereto, and may be in a curved shape protruding outward, namely, a shape of the entire opening 25 may be in a bowl shape. The opening 25 that has the sectional shape like this can be formed by performing multistage laser irradiation that properly adjusts the irradiation position of the laser and irradiation energy of the laser at the time of formation of the opening 25, or changes the irradiation position stepwise, for example.

Since a resin material is used for the resin mask 20, formation of the opening 25 is enabled without using the processing methods that are used in the conventional metal processing, for example, the processing methods such as etching and cutting. Namely, the method for forming the opening 25 is not specially limited, and the opening 25 can be formed by using various processing methods, for example, a laser processing method capable of forming the opening 25 with high definition, precision press processing, photolithography processing and the like. The method for forming the opening 25 by a laser processing method or the like will be described later.

As the etching processing method, for example, a wet etching method such as a spray etching method that sprays an etching agent at a predetermined spray pressure from an injection nozzle, an immersion etching method that immerses an object in an etching solution filled with an etching agent, and a spin etching method that drops an etching agent, and a dry etching method using gas, plasma and the like can be used.

(Metal Mask)

The metal mask 10 is composed of a metal, and the slits 15 that extend in the lengthwise direction or the crosswise direction are arranged in a plurality of rows in the position overlapping the openings 25, in other words, in the position where all of the openings 25 arranged in the resin mask 20 are visible, when seen from a front of the metal mask 10. Note that in FIGS. 2 and 3, the slits 15 that extend in the lengthwise direction of the metal mask 10 are continuously arranged in the crosswise direction. Further, in the embodiment shown in FIGS. 2 and 3, the example in which the slits 15 that extend in the lengthwise direction or the crosswise direction are arranged in a plurality of rows is cited and described, but the slits 15 may be arranged in only a single row in the lengthwise direction or in the crosswise direction.

Figure 3A:
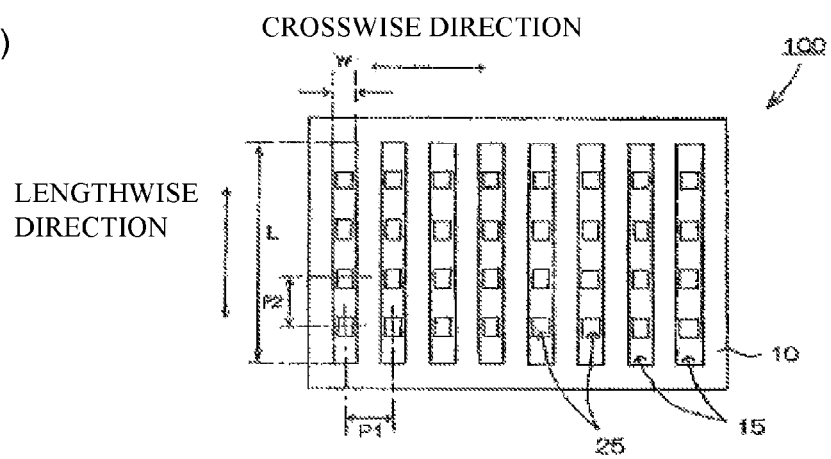
FIG. 3(a) is a front view of each of the mask portions shown in FIG. 2, seen from a metal mask side.

While a width W of the slit 15 is not specially limited, the width W is preferably designed to be shorter than at least the pitch between the adjacent openings 25. More specifically, as shown in FIG. 3(a), when the slit 15 extends in the lengthwise direction, the width W in the crosswise direction of the slit 15 is preferably made shorter than the pitch P1 of the openings 25 adjacent to each other in the crosswise direction. Similarly, though not illustrated, when the slit 15 extends in the crosswise direction, a width in the lengthwise direction of the slit 15 is preferably made shorter than a pitch P2 of the openings 25 adjacent to each other in the lengthwise direction. Meanwhile, a length L in the lengthwise direction in a case of the slit 15 extending in the lengthwise direction is not specially limited, and can be properly designed in accordance with the lengthwise length of the metal mask 10 and the positions of the openings 25 that are provided in the resin mask 20.

Further, the slit 15 that continuously extends in the lengthwise direction, or in the crosswise direction may be divided into a plurality of portions by a bridge 18. Note that FIG. 3(d) is a front view of the vapor deposition mask 100 seen from the metal mask 10 side, and shows an example in which the single slit 15 continuously extending in the lengthwise direction shown in FIG. 3(a) are divided into a plurality of portions (slits 15a and 15b) by the bridge 18. While a width of the bridge 18 is not specially limited, the width of the bridge 18 is preferably around 5 µm to 20 µm. By setting the width of the bridge 18 to be within this range, the rigidity of the metal mask 10 can be effectively enhanced. The arrangement position of the bridge 18 is not specially limited, but the bridge 18 is preferably arranged in such a manner that the slit after being divided is overlaid on the two or more of the openings 25.

Figure 3B:
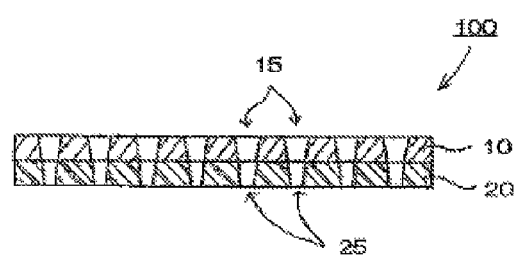
FIG. 3(b) is a schematic sectional view of the same mask portion, and FIGS. 3(c) and (d) are respectively front views of examples of the mask portion in other embodiments, seen from the metal mask side.
Figure 3C:
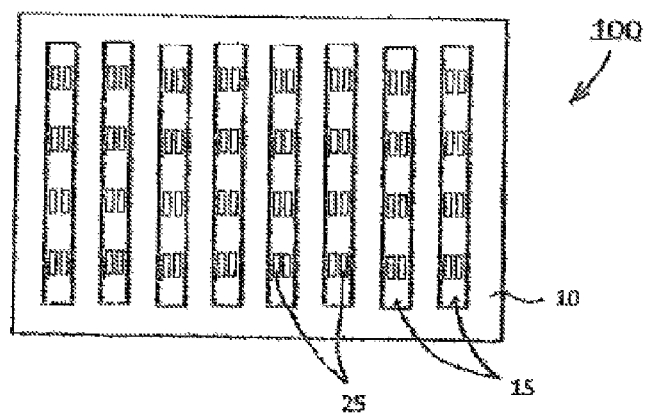
Figure 3D:
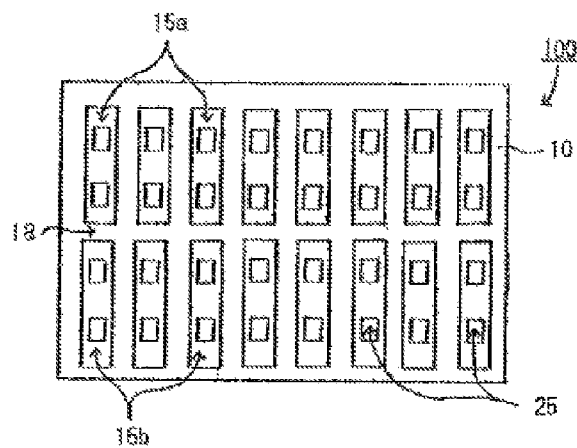

While a sectional shape of the slit 15 that is formed in the metal mask 10 is not specially limited, either, the sectional shape is preferably a shape that has broadening toward the vapor deposition source as shown in FIG. 3(b), similarly to the opening 25 in the above described resin mask 20.

The material of the metal mask 10 is not specially limited, and the conventionally known material in the field of the vapor deposition mask can be properly selected and used, and, for example, a metal material such as stainless steel, an iron-nickel alloy, and an aluminum alloy can be cited. Above all, an invar material that is an iron-nickel alloy can be preferably used since an invar material is hardly deformed by heat.

Further, when the vapor deposition mask 100 at a front side of the substrate needs to be attracted by a magnetic force by arranging a magnet or the like at a rear side of the substrate when vapor deposition is performed onto the substrate with use of the vapor deposition mask 100 of the present invention, the metal mask 10 is preferably formed of a magnetic substance. As the metal mask 10 of a magnetic substance, pure iron, carbon steel, W steel, Cr steel, Co steel, KS steel, MK steel, NKS steel, Cunico steel, an AL-Fe alloy and the like can be cited. Further, when the material itself that forms the metal mask 10 is not of a magnetic substance, magnetism may be given to the metal mask 10 by dispersing powder of the above described magnetic substance into the material.

While the thickness of the metal mask 10 is not specially limited, the thickness is preferably around 5 µm to 100 µm. In the case of consideration being given to prevention of a shadow at the time of vapor deposition, the thickness of the metal mask 10 is preferably small, but when the thickness of the metal mask 10 is made thinner than 5 µm, the risk of breakage and deformation is increased, and handling is likely to be difficult. However, since in the present invention, the metal mask 10 is integrated with the resin mask 20, the risks of breakage and deformation can be reduced even if the thickness of the metal mask 10 is very small such as 5 µm, and a metal mask is usable if the thickness thereof is 5 µm or more. Note that the case in which the thickness of the metal mask 10 is made larger than 100 µm is not preferable because generation of a shadow can arise.

Hereinafter, with use of FIG. 8(a) to FIG. 8(c), a relation of generation of a shadow, and the thickness of the metal mask 10 will be specifically described. As shown in FIG. 8(a), when the thickness of the metal mask 10 is small, the vapor deposition material that is released toward a vapor deposition target from a vapor deposition source passes through the slit 15 of the metal mask 10 and the opening 25 of the resin mask 20 without colliding with an inner wall surface of the slit 15 of the metal mask 10 and a surface of the metal mask 10 at a side where the resin mask 20 is not provided, and reaches the vapor deposition target. Thereby, formation of the vapor deposition pattern with a uniform film thickness onto the vapor deposition target is enabled. Namely, generation of a shadow can be prevented. Meanwhile, as shown in FIG. 8(b), when the thickness of the metal mask 10 is large, for example, when the thickness of the metal mask 10 is a thickness exceeding 100 µm, a part of the vapor deposition material that is released from the vapor deposition source collides with the inner wall surfaces of the slit 15 of the metal mask 10, and the surface of the metal mask 10 at the side where the resin mask 20 is not formed, and cannot reach the vapor deposition target. As the vapor deposition material that cannot reach the vapor deposition target increases more, an undeposited portion having a film thickness smaller than the intended vapor deposition film thickness occurs to the vapor deposition target more, namely, a shadow is generated.

In order to prevent generation of a shadow sufficiently, the sectional shape of the slit 15 is preferably made a shape having broadening toward the vapor deposition source, as shown in FIG. 8(c). By adopting the sectional shape like this, the vapor deposition material can be caused to reach the vapor deposition target without the vapor deposition material that is released from the vapor deposition source colliding with the surface of the slit 15 and the inner wall surface of the slit 15 even if the thickness of the entire vapor deposition mask is made large with the objective of prevention of distortion that can occur to the vapor deposition mask 100, or enhancement of durability. More specifically, the angle that is formed by a straight line connecting the lower bottom distal end in the slit 15 of the metal mask 10 and the upper bottom distal end in the slit 15 of the same metal mask 10, and the bottom surface of the metal mask 10 is preferably within a range of 25° to 65°. In particular, in this range, an angle that is smaller than the vapor deposition angle of the vapor deposition machine to be used is preferable. By adopting the sectional shape like this, the deposition material can be caused to reach the vapor deposition target without the vapor deposition material released from the vapor deposition source colliding with the inner wall surface of the slit 15 even when the thickness of the metal mask 10 is made relatively large with the objective of prevention of distortion that can arise in the vapor deposition mask 100, or enhancement of durability. Thereby, generation of a shadow can be prevented more effectively. Note that FIG. 8 is a partial schematic sectional view for explaining the relation of generation of a shadow and the slit 15 of the metal mask 10. Note that in the form shown in FIG. 8(c), the slit 15 of the metal mask 10 has the shape having broadening toward the vapor deposition source side, and the end surfaces that face each other of the opening of the resin mask 20 are substantially parallel with each other, but in order to prevent generation of a shadow more effectively, the sectional shapes of both the slit of the metal mask 10 and the opening 25 of the resin mask 20 are preferably the shapes having broadening toward the vapor deposition source side. Accordingly, in the method for producing the multiple-surface imposition vapor deposition mask of the present invention, the slit 15 of the metal mask 10 and the opening 25 of the resin mask 20 are preferably produced so that the sectional shapes of the slit of the metal mask and the opening of the resin mask become the shapes having broadening toward the vapor deposition source side.

FIGS. 9(a) to (d) are partial schematic sectional views showing the relation of the slit of the metal mask and the opening of the resin mask, and in the forms that are illustrated, the sectional shapes of entire openings that are formed by the slits 15 of the metal masks and the openings 25 of the resin masks show step shapes. As shown in FIG. 9, the sectional shapes of the entire openings are formed into step shapes having broadening toward the vapor deposition source sides, whereby generation of a shadow can be prevented effectively.

Accordingly, in the method for producing the multiple-surface imposition vapor deposition mask of the present invention, the vapor deposition mask is preferably produced in such a manner that the sectional shape of the entire opening that is formed by the slit of the metal mask and the opening 25 of the resin mask becomes a step shape.

In the sectional shapes of the slit 15 of the metal mask and the resin mask 20, the end surfaces that face each other may be substantially parallel with each other as shown in FIG. 9(a), but as shown in FIGS. 9(b) and (c), only any one of the slit 15 of the metal mask and the opening of the resin mask may have a sectional shape having broadening toward the vapor deposition source side. Note that as described in the above, in order to prevent generation of a shadow more effectively, both of the slit 15 of the metal mask, and the opening 25 of the resin mask preferably have the sectional shapes having broadening toward the vapor deposition source side as shown in FIG. 4 and FIG. 9(d).

A width of a flat portion (reference sign (X) in FIG. 9) in the section formed into the above described step shape is not specially limited, but when the width of the flat portion (X) is less than 1 μm, the effect of prevention of shadow generation tends to reduce due to interference of the slit of the metal mask. Accordingly, with this point taken into consideration, the width of the flat portion (X) is preferably 1 μm or more. A preferable upper limit value is not specially limited, and can be properly set with consideration given to the size of the opening of the resin mask, the space between the adjacent openings and the like, and as one example, the preferable upper limit value is approximately 20 μm.

Figure 10:
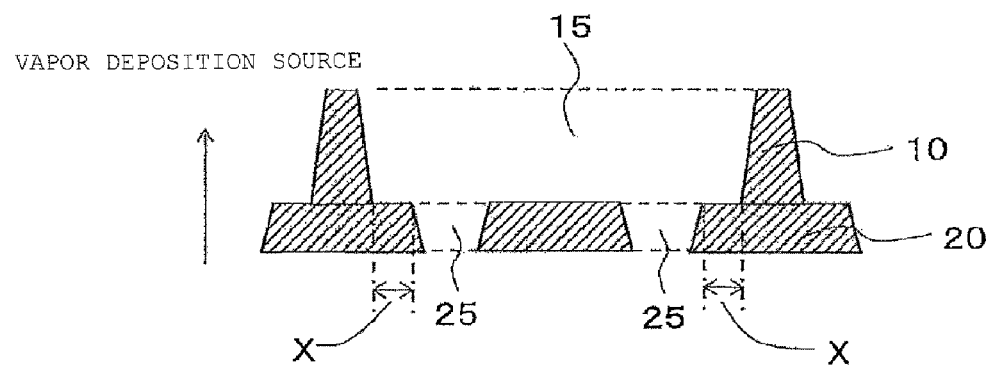
FIG. 10 is a partial schematic sectional view showing a relation of the slit of the metal mask and the opening of the resin mask.

Note that FIGS. 9(a) to (d) described above each shows an example in which the single opening 25 that overlaps the slit 15 is provided in the crosswise direction when the slit extends in the lengthwise direction, but as shown in FIG. 10, two or more of the openings 25 that overlap the slit 15 may be provided in the crosswise direction when the slit extends in the lengthwise direction. In FIG. 10, both the slit 15 of the metal mask and the opening 25 of the resin mask have sectional shapes having broadening toward the vapor deposition source side, and two or more of the openings 25 that overlap the slit 15 are provided in the crosswise direction.

(Frame)

Next, a configuration of the frame 2 for holding a plurality of vapor deposition masks 100 that are each configured by the combination of the metal mask 10 and the resin mask 20 as described above is not specially limited, and while in the embodiment shown in FIG. 1, for example, the frame 2 is formed by having a lengthwise sash bar portion 2b and a crosswise sash bar portion 2c for dividing the open space 3 formed by an outer frame portion into a plurality of portions in the lengthwise and crosswise directions thereof, in addition to a rectangular outer frame portion 2a, the presence or absence of the lengthwise sash bar portion 2b and the crosswise sash bar portion 2c is optional as long as the frame 2 has at least the outer frame portion 2a. For example, the configurations of the frame 2 which is formed by only the outer frame portion 2a as shown in FIG. 5(a), the frames 2 that are each formed by the outer frame portion 2a and either the lengthwise sash bar portion 2b or the crosswise sash bar portion 2c as shown in FIGS. 5(b), (c) and the like also can be adopted.

Further, as shown in FIG. 5(d), for example, the frame 2 having the outer frame portion 2a, the lengthwise sash bar portion 2b and the crosswise sash bar portions 2c as shown in FIG. 1 is set as a main body portion, and a plurality of small frame members 5 that can be respectively mounted in the openings that are formed by being divided by the lengthwise sash bar portion 2b and the crosswise sash bar portions 2b, and correspond to the respective masks can be additionally prepared for the main body portion. In this case, the resin film material 200 and the metal mask 10 are arranged in each of the plurality of small frame members 5 as will be described later, and thereafter, the small frame members 5 can be arranged in and joined to the openings corresponding to the respective masks of the frame 2 to be the main body portion.

Even when the frames 2 that are each formed by the outer frame portion 2a, and either the lengthwise sash bar portion 2b or the crosswise sash bar portion 2c as shown in FIGS. 5(b) and (c) are adopted, these frames 2 are used as the main body portions, a plurality of the small frame members 5 corresponding to the respective masks are additionally prepared similarly to the frame shown in FIG. 5(d), and these small frame members can be also arranged in and joined to the frames 2 to be the main body portions. In this case, in each of the frames 2 to be the main body portions, only either the lengthwise sash bar portion 2b or the crosswise sash bar portion 2c is present, but the crosswise or lengthwise sash bars that are not present in the frames 2 to be the main body portions can be supplemented by the small frame members 5.

(Production Method of the Present Invention)

A method for producing a multiple-surface imposition vapor deposition mask according to the present invention is a method for producing the multiple-surface imposition vapor deposition mask that is formed by arranging a plurality of masks 100 in the open space 3 in the frame 2 by dividing the plurality of masks 100 in the lengthwise and crosswise directions, wherein in configuring the aforementioned respective masks 100 each by the metal mask 10 provided with slits, and the resin mask 20 that is positioned on the front surface of the metal mask, and has the openings corresponding to the pattern to be produced by vapor deposition arranged by lengthwise and crosswise in a plurality of rows, the respective metal masks 10 and the resin film material 200 for producing the aforementioned resin masks are attached to the aforementioned frame 2, after which, the aforementioned resin film materials 200 are processed, and the openings corresponding to the pattern to be produced by vapor deposition are formed in a plurality of rows lengthwise and crosswise.

FIG. 6 is a process chart for describing the method for producing the multiple-surface imposition vapor deposition mask of the present invention. Note that (a) to (d) are all sectional views, and the wall thicknesses and the dimensions of the respective members are expressed in exaggeration to facilitate illustration.

Figure 6A:
FIGS. 6(a) to (d) are sectional views schematically showing respective steps of the production method of the present invention.

As shown in FIG. 6(a), the frame 2 is prepared first.

Figure 6B:
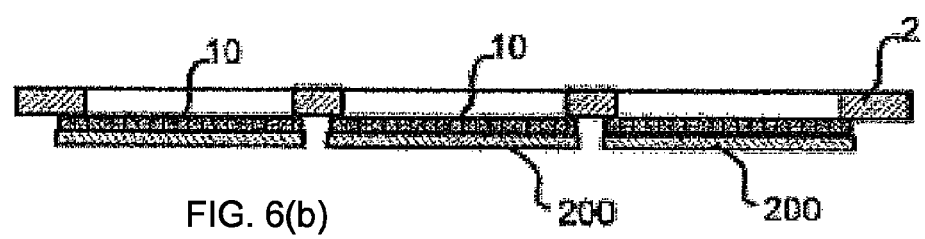

As shown in FIG. 6(b), a plurality of the metal masks 10 provided with slits, and the resin film materials 200 that are positioned on the front surfaces of the aforementioned plurality of metal masks are attached to the frame 2.

Here, while as for the positional precision in the arrangement of the metal masks 10 to the frame 2, there is no problem in enhancing the positional precision, in the production method of the present invention, the aforementioned plurality of metal masks 10 and the resin film materials 200 for forming the aforementioned resin masks are arranged in the frame 2, after which, the aforementioned resin film materials 200 are processed, and the openings corresponding to the pattern to be produced by vapor deposition are accurately provided. Therefore, especially high precision is not required at the time of arranging the metal masks 10, and even if the metal masks 10 are arranged relatively roughly, definition of the masks can be enhanced. For example, in arrangement of the aforementioned metal mask 10 in the aforementioned frame 2, even if a maximum allowable error in the width direction of the slits between the arrangement position in design and the actual arrangement position is within 0.2 times as large as the pitch P1 of the openings 25, is preferably within 0.15 times as large as the pitch P1, and a maximum allowable error in the lengthwise direction of the slits is within 5 mm, there is no risk of causing reduction in yield of products, and the operation efficiency can be enhanced.

Note that the method, the sequence and the like of attaching the plurality of metal masks 10 and the resin film materials 200 to the frame 2 are not specially limited, and various modes can be adopted. In this regard, details will be described as follows.

Figure 6C:
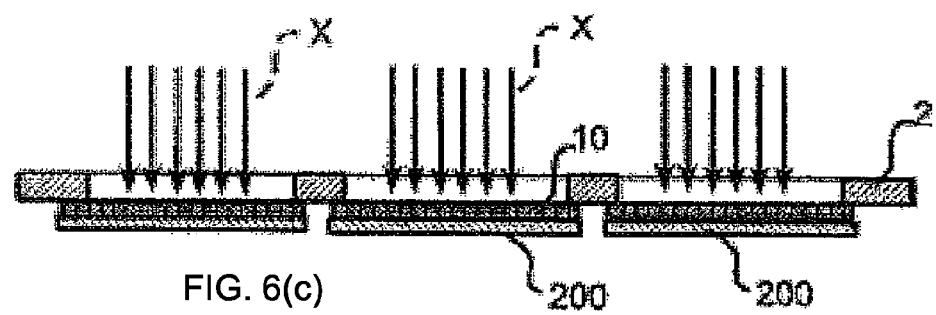
Figure 6D:
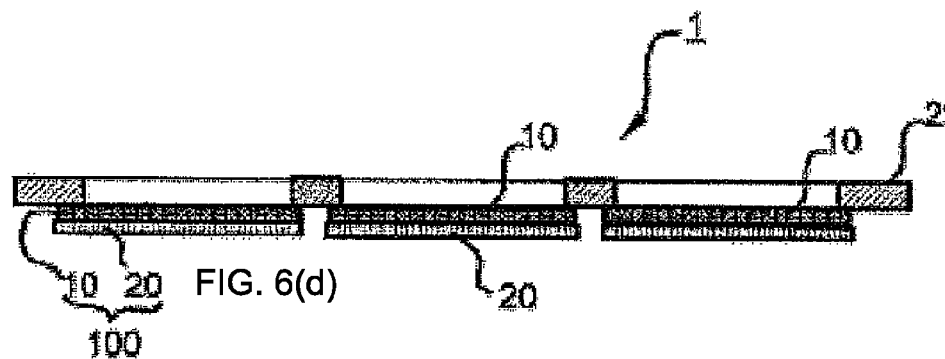
Figure 7A:
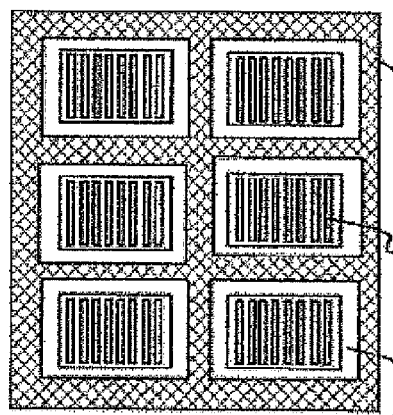
FIGS. 7(a) to (f) are schematic views respectively showing arrangement examples of the metal mask and a resin film material, which can be used in the production method of the present invention.
Figure 7B:
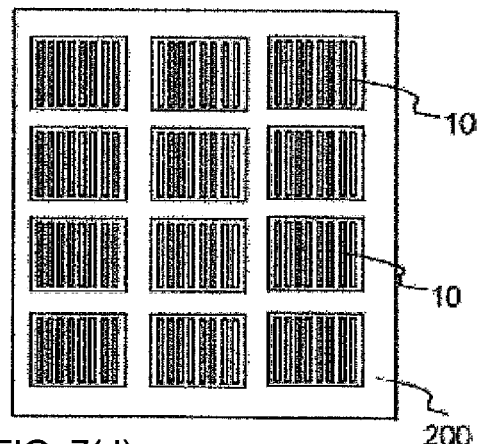
Figure 7C:
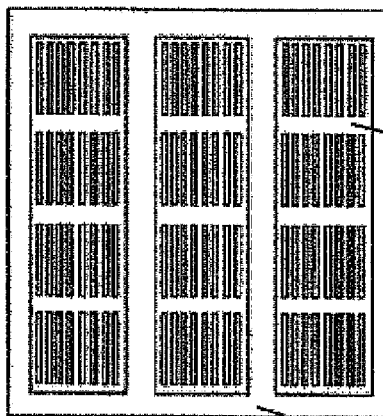
Figure 7D:
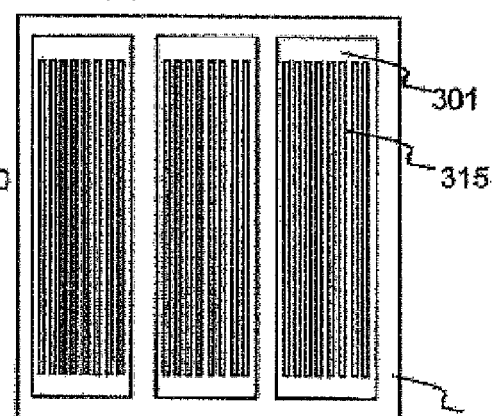
Figure 7E:
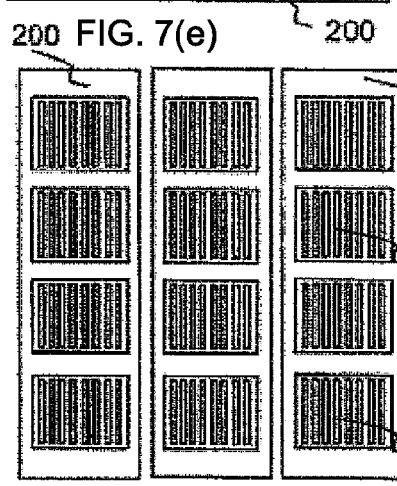
Figure 7F:
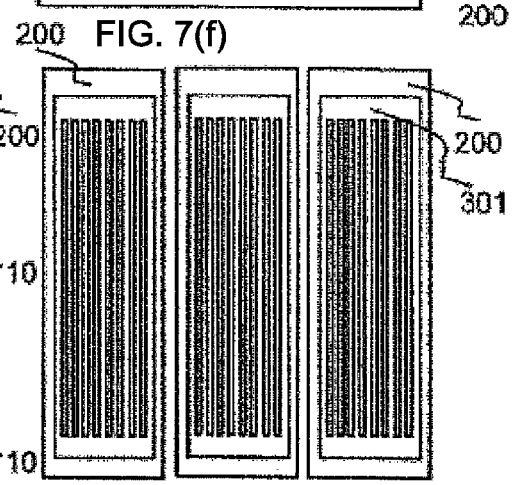

Thereafter, as shown in FIG. 6(c), the resin film materials 200 are processed in the state in which the plurality of metal masks and the resin film materials are all attached to the frame 2. As shown in FIG. 6(d), the openings corresponding to the pattern to be produced by vapor deposition are formed in a plurality of rows lengthwise and crosswise in the resin film, and the resin mask 20 is produced, whereby the multiple-surface imposition vapor deposition mask is produced. While the method for forming the openings by processing the resin film material 200 is not specially limited, the openings can be formed by pattern opening by, for example, the conventionally known laser processing method, a laser light X is emitted from the metal mask side, and the openings corresponding to the pattern to be produced by vapor deposition are formed in a plurality of rows lengthwise and crosswise in the aforementioned resin plate. Note that the pattern to be produced by vapor deposition in the description of the present application means the pattern to be produced by using the vapor deposition mask, and, for example, in the case of using the vapor deposition mask in formation of the organic layer of the organic EL element, the pattern is in the shape of the organic layer.

Note that when the resin film materials 200 are each processed to provide the openings in the state fixed to the state in which the plurality of metal masks and the resin film materials are all attached to the frame 2 as described above, a reference sheet that is provided in advance with a pattern corresponding to the openings 25 to be formed may be prepared, and in a state in which the reference sheet is bonded to a surface of the resin film material 200 at a side where the metal mask 10 is not provided, laser irradiation corresponding to the pattern on the reference sheet may be performed from the metal mask 10 side. According to the method, the openings 25 can be formed in the resin film material 200 in a so-called face-to-face state in which laser irradiation is performed while the pattern on the reference sheet bonded to the resin film material 200 is being watched, and the resin mask 20 having the openings 25 with high definition that have extremely high dimensional precision of the openings can be formed. Further, in this method, formation of the openings 25 is performed in the state fixed to the frame, the vapor deposition mask that is excellent in not only dimensional precision but also positional precision can be provided.

Note that in the case of using the above described method, it is necessary to be able to recognize the pattern on the reference sheet with a laser irradiator or the like through the resin film material 200 from the metal mask 10 side. As the resin film material 200, use of the resin film material having transparency is necessary when the material has a certain degree of thickness, but when the resin film material has a preferable thickness with the influence on a shadow taken into consideration as described above, for example, a thickness of approximately 3 μm to 25 μm, the pattern on the reference sheet can be recognized even if the resin film material is colored.

A method for bonding the resin film 200 and the reference sheet is not specially limited, and when the metal mask 10 is a magnetic body, for example, a magnet or the like is arranged at a rear side of the reference sheet, and the resin film material 200 and the reference sheet are bonded to each other by being attracted. Besides this, the resin film material 200 and the reference sheet also can be bonded to each other with use of an electrostatic adsorbing method or the like. As the reference sheet, a TFT substrate having a predetermined pattern, a photo mask and the like can be cited, for example.

(Optionally Set Matters in Production Method of the Present Invention: Method for Attaching Metal Mask and Resin Film Material to Frame and Attaching Sequence)

As described above, in the production method of the present invention, the method, the sequence and the like of attaching the plurality of metal masks 10 and the resin film material 200 to the frame 2 are not specially limited, and various modes can be adopted.

Namely, a method for supporting the metal mask 10 and the resin film material 200 to the frame 2 may be (A) a method that joins the metal mask 10 to the frame 2 by, for example, spot welding or the like, and supports the resin film material 200 that is joined to the metal mask 10 by an adhesive, a tackiness agent, fusion or the like to the frame 2 (In this case, the resin film material is equal to or a slightly smaller than the area of the metal mask.), or may be (B) a method that joins the resin film material 200 to the frame 2 by an adhesive, a tackiness agent, deposition (high frequency fusion or the like) or the like, and supports the metal mask 10 that is similarly joined to the resin film material by an adhesion, a tackiness agent, deposition (high frequency fusion or the like) or the like to the frame 2 (In this case, the metal mask is smaller than the area of the resin film material, and a plurality of metal masks can be arranged on a single resin film material.) Further, in any of the modes of (A) and (B), as to the sequence of joining, any of joining of the metal mask 10 or the resin film material 200 to the frame 2, and joining of the metal mask 10 and the resin film material 200 may be the first.

The resin film material may be a resin layer that is obtained by coating the metal plate to be the original plate of the metal mask 10 with a resin solution. In the mode as the above described (A), a resin-film coated metal plate that is produced by forming a resin film layer by coating the metal plate to be the original plate of the metal mask 10 with a resin solution, or by performing resin coating at the time of extending the metal plate, for example, can be used. Alternatively, a metal plate with a resin layer also can be obtained by bonding the resin sheet to the metal plate. As a method for bonding the metal plate and the resin plate, various tackiness agents may be used, or a resin sheet having self-adhesiveness may be used, for example. In this case, slits that penetrate through only the metal plate are formed into the metal plate having a front surface coated with the resin film material, and thereby, the metal mask 10 to which the resin film material 200 is bonded is made. The process step is not specially limited, and may be any process step as long as desired slits can be formed in only the metal mask, but a known dry or wet etching method or the like can be adopted, for example. Formation of the metal slits from the metal plate like this can be carried out either before or after the resin-film coated metal plate is joined to the frame 2.

Since the resin film layer causes change with passage of time due to the influence of a temperature and humidity during a certain time period after formation, it is preferable from the viewpoint of enhancement in yield to provide a so-called aging period until the shape is fixed.

Further, in the mode as in the above described (B), as a method for arranging the metal mask to the resin film material 200, various modes can be adopted. Examples of the embodiment like this are shown in FIGS. 7(*a*) to (*f*).

An embodiment shown in FIG. 7(*a*) shows an example of using a plurality of resin film materials 200 which are in one to one correspondence with the respective plurality of metal masks 10.

In this embodiment, as the frame 2 for use, a frame having the outer frame portion 2*a*, the lengthwise sash bar portion 2*b* and the crosswise sash bar portion 2*c* as illustrated in FIG. 1 shown above is used, or a frame in which a plurality of the small frame members 5 as shown in FIG. 5(*d*) are additionally prepared, and the resin film materials 200 each having the single metal mask 10 arranged thereon are respectively joined to the respective openings corresponding to the respective masks. Note that joining of the respective metal masks 10 to the respective resin film materials 200 can be carried out either before or after joining of the respective resin film materials 200 to the frame 2.

The embodiments shown in FIGS. 7(*b*) to (*d*) show examples of each using a single sheet of the resin film material which substantially covers the entire surface of the open space in the aforementioned frame, as the aforementioned resin film material 200.

In the embodiment of FIG. 7(*b*), a plurality of the metal masks 10 are arranged in the lengthwise and crosswise directions of the resin film material 200.

Note that the plurality of metal masks 10 do not have to be always formed as separate members respectively as shown in FIG. 7(*b*), and as the plurality of metal masks, some of the plurality of masks, for example, all or some of the masks in the single row in the lengthwise or crosswise arrangement are formed as a metal mask aggregate member integrally formed, and a plurality of the metal mask aggregate members can be used. The embodiments shown in FIGS. (c) and (d) show examples as above. In the embodiment of FIG. 7(*c*), a metal mask aggregate member 300 that is integrally formed by all of a plurality of metal masks in a single row in the lengthwise direction in the drawing is produced, and a plurality of the metal mask aggregate members 300 are arranged in the crosswise direction in the drawing. Further, in the embodiment of FIG. 7(*d*), a metal mask aggregate member 301 integrally formed by all of a plurality of metal masks in a single row in the lengthwise direction in the drawing is adopted similarly to FIG. 7(*c*), but in the metal mask aggregate member 301, frame portions that divide the respective metal masks from one another in the crosswise direction are not present, unlike the metal mask aggregate member 300 of FIG. 7(*c*), and in the metal mask aggregate member 301, slits 315 that are formed in the lengthwise direction in the drawing are formed to continue throughout substantially an entire length thereof. Even in the mode as shown in FIG. 7(*d*), the frame having the shape that is suitable as the shape of the frame 2, that is, the frame having the outer frame portion 2*a*, and the lengthwise sash bar portion 2*b* and the crosswise sash bar portion 2*c* as illustrated in FIG. 1, or the frame having the outer frame portion 2*a* and the crosswise sash bar portion 2*c*, or the like is used in combination, whereby the individual metal masks can be formed by being divided from one another. Note that in the embodiment as shown in FIG. 7(*d*), from the positional relation of the frame 2 with the sash portions, the metal mask aggregate members 301 are arranged in the resin film material 200 prior to joining of the resin film material 200 to the frame 2.

As the aforementioned resin film material 200, the embodiments shown in FIGS. 7(*e*) and (*f*) each shows an example of combining a plurality of sheets of resin film material each having a length corresponding to a dimension in any one direction of the lengthwise and the crosswise directions of the open space in the aforementioned frame 2, and having a length shorter than the dimension of the open space in the other direction. Namely, the embodiments shown in FIGS. 7(*e*) and (*f*) each shows the example of combining a plurality of sheets of the aforementioned resin film material 200 each having a length corresponding to the dimension in the lengthwise direction of the open space in the frame 2 in which the resin film is to be fitted, and having a length shorter than the dimension in the crosswise and lengthwise direction of the open space.

As the resin film material has a larger area, the dimensional changes due to external stress applied at the time of being attached to the frame 2, thermal expansion or contraction, and the like tends to be relatively larger, and the size of the resin film material is reduced to a certain degree, these problems can be decreased.

In the embodiment of FIG. 7(*e*), a plurality of metal masks 10 are arranged in each of the rows in the lengthwise direction of the respective resin film materials 200 with short widths as described above. Note that joining of the plurality of metal masks 10 to the aforementioned resin film materials 200 can be carried out either before or after joining of the respective resin film materials 200 to the frame 2.

Further, in the embodiment of FIG. 7(*f*), the metal mask aggregate members 301 having the similar shapes to those shown in the aforementioned FIG. 7(*d*) are arranged one by one. As the shape of the frame 2 that is combined with the metal mask aggregate members 301 like this is similar to the shape that is described in the embodiment of FIG. 7(*d*). Note that in the embodiment like this, it is necessary to arrange the metal mask aggregate members 301 in the resin film material 200 prior to joining of the resin film material 200 to the frame 2, as described above.

(Optionally Set Matter in Production Method of the Present Invention: Slimming Step)

Further, in the production method of the present invention, a slimming step may be performed between the steps described above, or after the steps. The step is an optional step in the production method of the present invention, and is the step of optimizing the thickness of the metal mask 10, and the thickness of the resin mask 20. The preferable thicknesses of the metal mask 10 and the resin mask 20 may be properly set in the aforementioned preferable ranges, and the detailed explanation here will be omitted.

For example, when as the metal plate with a resin film, a metal plate with a resin film having a certain degree of thickness is used, excellent durability and transportability can be given when the metal plate with a resin film and the metal mask 10 with a resin film are transported during the production process, and when the multiple-surface imposition vapor deposition mask 1 that is produced according to the above described production method is transported. Meanwhile, in order to prevent generation of a shadow or the like, the thicknesses of the respective vapor deposition masks 100 that are incorporated in the multiple-surface imposition vapor deposition mask 1 that is obtained according to the production method of the present invention is preferably the optimum thicknesses. The slimming step is a useful step in the case of optimizing the thickness of the vapor deposition mask 100 while satisfying durability and transportability during the production process or after the process.

Slimming of the metal plate to be the metal mask 10 and the metal mask 10, namely, optimization of the thickness of the metal mask can be realized by etching the surface of the metal plate at the side that is not in contact with the resin film 200, or the surface of the metal mask 10 at the side that is not in contact with the resin film 200 or the resin mask 20 by using the etching agent capable of etching the metal plate and the metal mask 10, between the steps described above, or after the steps.

Slimming of the resin film 200 to be the resin mask 20 and the resin mask 20, namely, optimization of the thicknesses of the resin film 200 and the resin mask 20 is similar to the above, and can be realized by etching the surface of the resin film 200 at the side that is not in contact with the metal plate and the metal mask 10, or the surface of the resin mask 20 at the side that is not in contact with the metal mask 10 by using the etching agent capable of etching the materials of the resin film 200 and the resin mask 20. Further, after the multiple-surface imposition vapor deposition mask 1 is formed, both the metal mask 10 and the resin mask 20 are subjected to etching processing, whereby the thicknesses of both of them also can be optimized between the steps described above, or after the steps.

In the slimming step, the etching agent for etching the resin film 200 or the resin mask 20 can be properly set in accordance with the resin material of the resin film 200 or the resin mask 20, and is not specially limited. For example, when a polyimide resin is used as the resin material for the resin film 200 or the resin mask 20, an alkali aqueous solution in which sodium hydroxide or potassium hydroxide is dissolved, hydrazine and the like can be used, as the etching agent. As the etching agent, a commercially available product can be directly used, and as the etching agent for a polyimide resin, TPE3000 made by Toray Engineering Co., Ltd. or the like is usable.

(Method for Producing Organic Semiconductor Element)

A method for producing an organic semiconductor element of the present invention is characterized by forming an organic semiconductor element by using the multiple-surface imposition vapor deposition mask 1 produced according to the production method of the present invention described in the above. As for the multiple-surface imposition vapor deposition mask 1, the multiple-surface imposition vapor deposition mask 1 produced according to the production method of the present invention described above can be directly used, and therefore, the detailed explanation here will be omitted. According to the multiple-surface imposition vapor deposition mask of the present invention described above, an organic semiconductor element having a pattern with high definition can be formed by the openings 25 with high dimensional precision which are included by the respective vapor deposition masks 100 arranged in the multiple-surface imposition vapor deposition mask 1. As the organic semiconductor element that is produced according to the production method of the present invention, an organic layer of an organic EL element, a light emitting layer, a cathode electrode and the like, for example, can be cited. In particular, the method for producing the organic semiconductor element of the present invention can be favorably used in production of the R, G and B light emitting layers of the organic EL element which are required to have pattern precision with high definition.

The present invention is described specifically based on the embodiments thus far, but the present invention is not limited to the embodiments as described as above in any way, and can adopt various forms within the range described in claims.

REFERENCE SIGNS LIST

1 Multiple-surface imposition vapor deposition mask
2 Frame
3 Open space in frame
100 Vapor deposition mask
10 Metal mask
15 Slit
18 Bridge
20 Resin mask
25 Opening
200 Resin film material

The invention claimed is:

1. A multiple-surface imposition vapor deposition mask formed by arranging a plurality of masks in an open space in a frame by dividing the plurality of masks in lengthwise and crosswise directions of the open space,
wherein each of the masks is configured by a metal mask provided with a slit, and a resin mask that is positioned on a front surface of the metal mask, and has openings corresponding to a pattern to be produced by vapor deposition arranged by lengthwise and crosswise in a plurality of rows.

\* \* \* \* \*